United States Patent [19]

Hara et al.

[11] 4,025,877

[45] May 24, 1977

[54] MULTI-STAGE ASTABLE MULTIVIBRATOR

[75] Inventors: Hirohito Hara, Fujisawa; Hironori Shimamura, Yokohama, both of Japan

[73] Assignee: Nippon Electronics Memory Industry Co., Ltd., Tokyo, Japan

[22] Filed: July 8, 1975

[21] Appl. No.: 594,113

[30] Foreign Application Priority Data

Dec. 26, 1974 Japan .............................. 49-148285

[52] U.S. Cl. ............................ 331/113 R; 331/144
[51] Int. Cl.² ....................................... H03K 3/282
[58] Field of Search ............... 331/113 R, 144, 145; 332/14

[56] References Cited

UNITED STATES PATENTS

| | | | |
|---|---|---|---|
| 2,874,315 | 2/1959 | Reichert, Jr. | 331/113 R X |
| 3,559,096 | 1/1971 | Lokerson | 331/113 R |

*Primary Examiner*—Siegfried H. Grimm
*Attorney, Agent, or Firm*—Burgess Ryan and Wayne

[57] ABSTRACT

A multi-stage astable multivibrator wherein a plurality of astable multivibrators each consisting of two transistors are connected in parallel so that a high output may be derived and a completely rectangular output waveform may be obtained. Diodes are connected to the emitters of the transistors so that the breakdown of the transistors may be prevented.

4 Claims, 4 Drawing Figures

(A)

(B)

(C)

(D)

MULTI-STAGE ASTABLE MULTIVIBRATOR

BACKGROUND OF THE INVENTION

The present invention relates to a multi-stage astable multivibrator.

In the conventional astable multivibrators, the feedback circuits of the two transistors are capacitively coupled so that the transistors may be alternately conducted and cut off. However, the reverse-breakdown voltage between the base and emitter of the transistor is generally so low that there is a fear that the transistor is degraded or broken down when the high reverse voltage is applied thereto. Furthermore, the output is low, and the output waveform has the rounded rising side so that the completely rectangular output waveform cannot be obtained.

SUMMARY OF THE INVENTION

In view of the above, one of the objects of the present invention is to provide a multi-stage astable multivibrator of the type comprising a plurality of or at least two astable multivibrators each consisting of two transistors, whereby the high output may be derived.

Another object of the present invention is to provide a multi-stage astable multivibrator which may produce the substantially completely rectangular output waveform by the sequential conduction of the transistors.

A further object of the present invention is to provide a multi-stage astable multivibrator in which diodes are connected to the emitters of the transistors so that the breakdown of the latter may be prevented.

Briefly stated, according to the present invention, a first and a second transistors have their collectors connected to the bases of the second and first transistors, respectively, through a parallel circuit consisting of a resistor and a speed-up capacitor, the bases of the first and second transistors being directly connected to a power supply; and the emitters of the first and second transistors are connected directly or through a diode to the collectors of a third and a fourth transistors, respectively, the bases of the third and fourth transistors being connected through a capacitor to the collectors of the fourth and third transistors, respectively, the bases of the third and fourth transistors being connected through a resistor to the power supply.

DESCRIPTION OF THE PREFERRED EMBODIMENT

Figure 1:
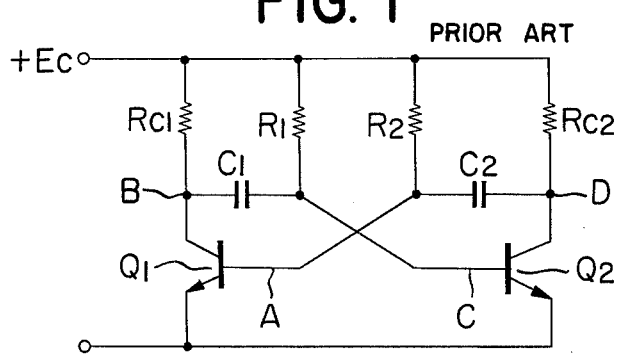
FIG. 1 is a circuit diagram of a conventional astable multivibrator.
Figure 2:
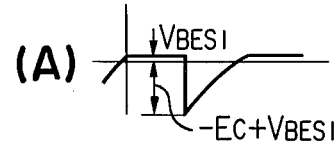
FIG. 2 shows the waveforms used for the explanation thereof.
Figure 2:
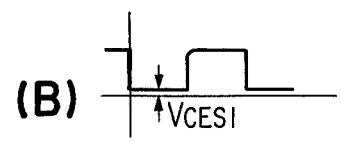
Figure 2:
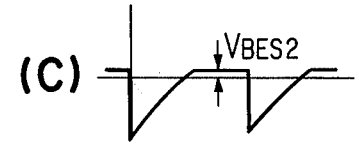
Figure 2:
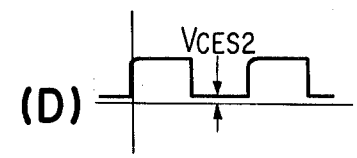

Prior Art, FIGS. 1 and 2

Prior to the description of the preferred embodiment of the present invention, the prior art astable multivibrator will be briefly described with reference to FIGS. 1 and 2. The astable multivibrator comprises two transistors $Q_1$ and $Q_2$, collector resistors $R_{C1}$ and $R_{C2}$, resistors $R_1$ and $R_2$ and capacitors $C_1$ and $C_2$ which determine the time constants. FIGS. 2A and 2B show the voltage waveforms at the base and collector, respectively, of the transistor $Q_1$ while FIGS. 2C and 2D, the voltage waveforms at the base and collector, respectively, of the transistor $Q_2$. Assume that the transistor $Q_1$ conducts. Then, the base voltage A and the collector voltae B of the transistor $Q_1$ are $V_{BES1}$ and $B_{CES1}$, respectively, of FIGS. 2A and 2B, and the collector voltage D of the transistor $Q_2$ is Ec while the base voltage C, a certain negative value at which the transistor $Q_2$ is cut off. The capacitor $C_1$ is charged through the resistor $R_1$ with the supply voltage Ec, the base potential C of the transistor $Q_2$ rises exponentially and reaches $V_{BES2}$ shown in FIG. 2C, at which the transistor $Q_2$ conducts. Immediately before the transistor $Q_2$ conducts, the base potential A of the transistor $Q_1$ is $V_{BES1}$ while the collector potential D of the transistor $Q_2$, at Ec. Therefore, when the transistor $Q_2$ conducts so that the collector potential D suddenly drops to $V_{CES2}$, the base potential of the transistor $Q_1$ drops from $V_{BES1}$ to $-Ec + V_{BES1} + V_{CES2}$ so that the transistor $Q_1$ is cut off. The collector potential B of the transistor $Q_1$ rises to Ec while the base potential rises from $-Ec + V_{BES1} + V_{CES1}$ toward Ec exponentially with the time constant dependent upon the values of the capacitor $C_2$ and the resistor $R_2$. When the base potential reaches $V_{BES1}$, the transistor $Q_1$ conducts while the transistor $Q_2$ is cut off. Thus the transistors $Q_1$ and $Q_2$ are alternately conducted and cut off; that is, the astable multivibrator oscillates. However, in general, the reverse-breakdown voltage between the base and emitter of the transistor is considerably low so that the high reverse-breakdown voltage of $-Ec + V_{BES1} + V_{CES2}$ causes the degradation and breakdown of the transistor. Furthermore, the output is low, and the output waveform has the rounded rising side so that the complete rectangular waveform cannot be obtained.

The Invention

Figure 3:
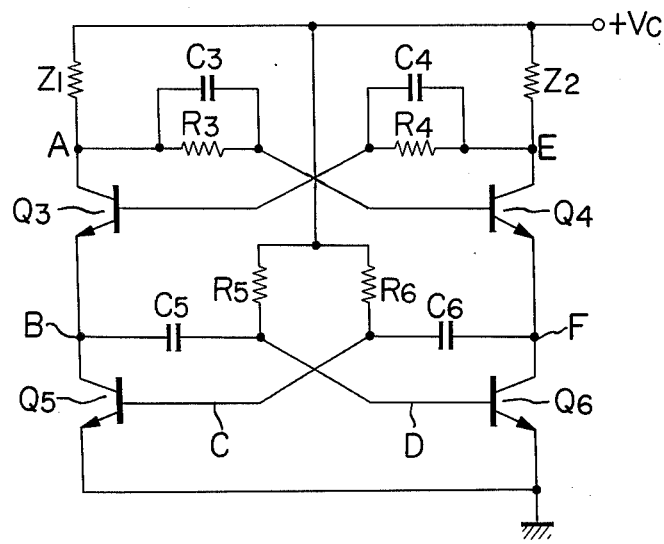
FIGS. 3 and 4 are circuit diagrams of a first and a second embodiments of the present invention, respectively.

Fist Embodiment, FIG. 3

Next referring to FIG. 3, the first embodiment of the multi-stage astable multivibrator in accordance with the present invention will be described. The collectors of transistors $Q_3$ and $Q_4$ are connected through loads $Z_1$ and $Z_2$ to the power supply $+Vc$, and the collector of the transistor $Q_3$ is connected to the base of the transistor $Q_4$ through a parallel circuit consisting of a capacitor $C_3$ and a resistor $R_3$ while the collector of the transistor $Q_4$ is connected to the base of the transistor $Q_3$ through a parallel circuit consisting of a capacitor $C_4$ and a resistor $R_4$. The emitters of the transistors $Q_3$ and $Q_4$ are connected to the collectors, respectively, of transistors $Q_5$ and $Q_6$. The collector of the transistor $Q_5$ is connected to the base of the transistor $Q_6$ through a capacitor $C_5$ while the collector of the transistor $Q_6$ is connected to the base of the transistor $Q_5$ through a capacitor $C_6$. The bases of the transistors $Q_5$ and $Q_6$ are also connected through resistors $R_6$ and $R_5$, respectively, to the power supply $+Vc$. The emitters of the transistors $Q_5$ are $Q_6$ are grounded.

Next the mode of operation of the astable multivibrator with the above configuration will be described. Assume that the transistors $Q_3$ and $Q_5$ are conducred. Then the potential at the point A or the collector voltage of the transistor $Q_3$ is at $V_{CES3} + V_{CES5}$ while the potential at the point B or the collector voltage of the transistor $Q_5$ is at $V_{CES5}$. The base potential of the transistor $Q_5$ is at $V_{BES5}$ while the base potential of the transistor $Q_6$, at a certain negative potential. The potential at the point E or the collector potential of the transistor $Q_4$ is at $+Vc$. The negative potential at the point D cuts off both the transistors $Q_4$ and $Q_6$. When the voltage across the capacitor $C_5$ rises so that the potential at the point D also rises to $V_{BES6}$, the transistor $Q_6$ conducts while the transistor $Q_5$ is cut off so that the emitter potential of the transistor $Q_3$ rises to $+Vc$. As a result the transistor $Q_3$ is also cut off while the transistor $Q_4$ conducts as the emitter potential of the transistor $Q_4$ drops to $V_{CES6}$ as the transistor $Q_6$ conducts. The potential at the point E is $V_{CES6} + V_{CES4}$ while the potential at the point C is $-Vc + V_{BES5} + V_{CES6}$. Therefore both the transistors $Q_3$ and $Q_5$ are cut off. The base current flows through the load resistor $Z_1$ and the resistor $R_3$ into the transistor $Q_4$ so that the latter is conducted. The conduction of the transistor $Q_4$ occurs very rapidly because the speed-up capacitor $C_3$ is connected in parallel with the resistor $R_3$. As the transistor $Q_6$ conducts, the potential at the point C rises expotentially and reaches $V_{BES6}$, at which the transistor $Q_5$ conducts while the transistors $Q_4$ and $Q_6$ are cut off. As described above, the transistors $Q_4$ and $Q_6$ and the transistors $Q_3$ and $Q_5$ are alternately conducted and cut off.

$V_{CES3}$, $V_{CES4}$, $V_{CES5}$ and $V_{CES6}$ are the saturation voltages between the collector and emitter of the transistors $Q_3$ to $Q_6$, respectively; $V_{BES3}$, $V_{BES4}$, $V_{BES5}$ and $V_{BES6}$, the forward voltages from the base to emitter of the transistors $Q_3$–$Q_6$, respectively.

The multi-stable astable multivibrator of the type described has a high output and a very short rise and fall time because the speed-up capacitors $C_3$ and $C_4$ are inserted. Unlike the prior art astable multivibrator, the output terminals E and A are not connected through capacitors to the base of the transistors and are not connected to the integrators which in turn are connected to the power supply, the rise and fall time are very short so that the complete rectangular output waveform may be derived.

Figure 4:
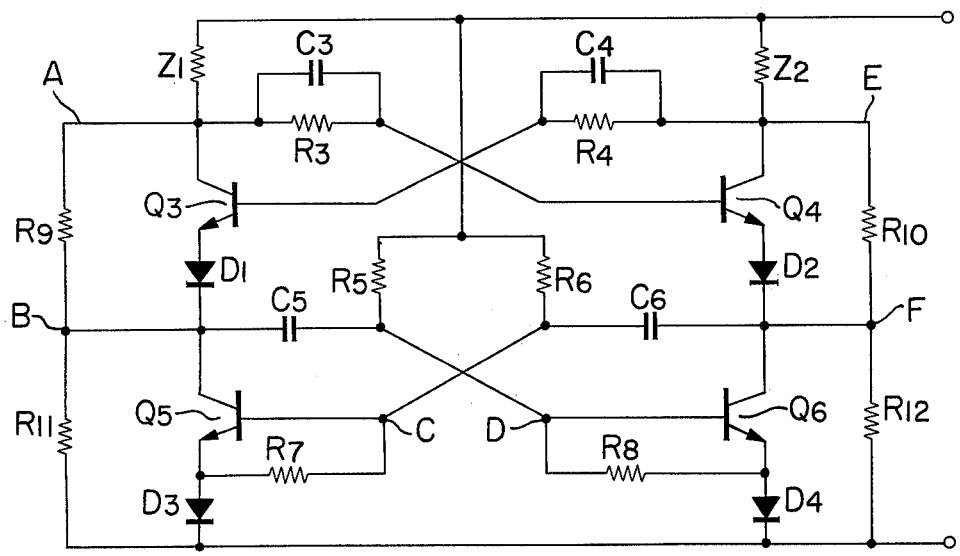

Second Embodiment, FIG. 4

The second embodiment shown in FIG. 4 is substantially similar in construction to the first embodiment described so far with reference to FIG. 3 except that diodes $D_1$–$D_4$ are connected to the emitters of the transistors $Q_3$–$Q_6$, respectively; resistors $R_7$ and $R_8$ are inserted between the base and emitter of the transistors $Q_5$ and $Q_6$, respectively; and resistors $R_9$–$R_{12}$ are interconnected between the collectors of the transistors $Q_3$–$Q_6$ and the cathodes of the diodes $D_1$–$D_4$.

Next the mode of operation of the second embodiment with the above configuration will be described. Assume that the transistors $Q_3$ and $Q_5$ conduct. Then, the potential at the point A is $V_{D3} + V_{CES5} + V_{D1} + V_{CES3}$; the potential at the point B, $V_{D3} + V_{CES5}$; the potential at the point E, $+Vc$; the potential at the point F, $½Vc$; and the potential at the point D, at a certain negative value, at which the transistors $Q_4$ and $Q_6$ are cut off. When the capacitor $C_5$ is charged so that the potential at the point D rises to $V_{D4} + V_{BES6}$, the transistor $Q_6$ conducts so that the potential at the point F drops from $½Vc$ to $V_{CES6}$ while the potential at the point C changes from $V_{D3} + V_{BES6}$ to $-½Vc + V_{BES6} + V_{D4}$. As a result, both the transistors $Q_3$ and $Q_5$ are cut off so that the base current flows through the load $Z_1$ and the resistor $R_3$ into the transistor $Q_4$. The voltage across the capacitor $C_6$ rises exponentially toward $Vc$ and when the potential at the point C rises to $V_{BES5} + V_{D3}$, the transistor $Q_5$ conducts while the transistors $Q_4$ and $Q_6$ are cut off and the transistor $Q_3$ conducts. The $V_{BES3}-V_{BES6}$ and $V_{CES3}-V_{CES6}$ have been already explained above, and $V_{D1}-V_{D4}$ are the forward voltages of the diodes $D_1$–$D_4$, respectively.

The insertion of the diodes $D_1$–$D_4$ and the resistors $R_9$–$R_{12}$ may attain the following features. When the transistors $Q_3$ and $Q_5$ are cut off, the voltage from the collector to emitter of the transistor $Q_3$ is $R_9 Vc/(R_9 + R_{11})$ while the voltage from the collector to emitter of the transistor $Q_5$ is $R_{11} Vc/(R_9 + R_{11})$. When the transistors $Q_4$ and $Q_6$ are cut off, the voltage from the collector to emitter of the transistor $Q_4$ is $R_{10} Vc/(R_{10} + R_{12})$ and the voltage from the emitter to collector of the transistor $Q_6$, $R_{12} Vc/(R_{10} + R_{12})$. Therefore, the astable multivibrator may oscillate even when the supply voltage $+Vc$ is high, but the following conditions must be satisfied:

$$Z_1 << R_9$$

$$Z_1 << R_{11}$$

$$Z_2 << R_{10},$$

and $$Z_2 << R_{12}.$$

Even when the potential at the point B is $½Vc$ which is higher than the potential at the point E of $V_{CES4} + V_{D2} + V_{CES6} + V_{D4}$, the transistor $Q_3$ is protected by the diode $D_1$. In like manner, even when the potential at the point F becomes $+½Vc$ which is higher than the potential $V_{CES2} + V_{D1} + V_{CES5} + V_{D3}$ at the point A, the transistor $Q_4$ is protected by the diode $D_2$. Furthermore, even when the reverse bias voltage of $-½Vc + V_{BES5} + V_{D3}-½Vc + V_{BES6} + V_{D4}$ is applied to either the point C or D, the transistors, $Q_5$ and $Q_6$ are protected by the diodes $D_3$ and $D_4$. The resistors $R_7$ and $R_8$ have a double function of supplying the emitter-base current $I_{EBO}$ to the transistors $Q_5$ and $Q_6$ and of stabilizing the oscillation of the astable multivibrator. Furthermore, the resistors $R_7$ and $R_8$ have a function of discharging the charge stored in these transistors. The resistors $R_9$ and $R_{11}$ are inserted to maintain the appropriate voltages between the collector and emitter of the transistors $Q_3$ and $Q_5$ while the resistors $R_{10}$ and $R_{12}$ maintain the suitable voltage between the collector and emitter of the transistors $Q_4$ and $Q_6$, whereby th oscillation may be stabilized.

What is claimed is:

1. A multi-stage astable multivibrator comprising
   a. first and second NPN transistors with the collectors of said first and second NPN transistors connected to the bases of the second and first NPN transistors, respectively, through a parallel circuit consisting of a resistor and a capacitor, and
   b. third and fourth NPN transistors with their collectors D.C. coupled to the emitters of said first and second NPN transistors, respectively, and with the collectors of said third and fourth NPN transistors connected to the bases of said fourth and third NPN transistors, respectively, through a capacitor and the bases of said third and fourth NPN transistors connected through resistors to a power supply.

2. A multi-stage astable multivibrator comprising
   a. first and second transistors with the collectors of said first and second transistors connected to the bases of the second and first transistors, respectively, through a parallel circuit consisting of a resistor and a capacitor; and b. third and fourth transistors with their collectors connected to the emitters of said first and second transistors, respectively, through diode means, and with the collectors of said third and fourth transistors connected to the bases of said fourth and third transistors, respectively, through a capacitor, the bases of said third and fourth transistors connected through resistors to one terminal of a power supply, and the emitters of said third and fourth transistors, each being connected through diode means to another terminal of said power supply.

3. A multi-stage astable multivibrator as set forth in claim 2 wherein
a resistor is inserted between the base and emitter of each of said third and fourth transistors.

4. A multi-stage astable multivibrator as set forth in claim 2 wherein
the collectors of said first and second transistors are connected through resistor means to the collectors of said third and fourth transistors, respectively; and the collectors of said third and fourth transistors are grounded through resistor means.

* * * * *

UNITED STATES PATENT OFFICE
CERTIFICATE OF CORRECTION

Patent No. 4,025,877           Dated May 24, 1977

Inventor(s)   Hirohito Hara, et al

It is certified that error appears in the above-identified patent and that said Letters Patent are hereby corrected as shown below:

Column 2, line 4:  "voltae" should be --voltage--.

line 61: "conducred" should be --conducted--.

Signed and Sealed this

Twenty-eighth Day of February 1978

[SEAL]

*Attest:*

RUTH C. MASON  
*Attesting Officer*

LUTRELLE F. PARKER  
*Acting Commissioner of Patents and Trademarks*